US010372033B2

(12) United States Patent
Yamamoto et al.

(10) Patent No.: US 10,372,033 B2
(45) Date of Patent: Aug. 6, 2019

(54) IMPRINT APPARATUS, AND METHOD OF MANUFACTURING ARTICLE

(71) Applicant: CANON KABUSHIKI KAISHA, Tokyo (JP)

(72) Inventors: Kenji Yamamoto, Utsunomiya (JP); Noburu Takakura, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 423 days.

(21) Appl. No.: 14/796,065

(22) Filed: Jul. 10, 2015

(65) Prior Publication Data

US 2016/0016353 A1  Jan. 21, 2016

(30) Foreign Application Priority Data

Jul. 15, 2014 (JP) .................................. 2014-145382

(51) Int. Cl.
*G03F 7/00* (2006.01)
(52) U.S. Cl.
CPC .................................. *G03F 7/0002* (2013.01)
(58) Field of Classification Search
CPC . B29C 59/002; G03F 7/70483; G03F 7/0002; B41F 19/02
USPC .......................................................... 264/40
See application file for complete search history.

(56) References Cited

U.S. PATENT DOCUMENTS

| 8,187,515 B2* | 5/2012 | Sreenivasan | B82Y 10/00 264/293 |
|---|---|---|---|
| 8,973,495 B2 | 3/2015 | Kasumi et al. | |
| 2006/0272535 A1* | 12/2006 | Seki | B82Y 10/00 101/492 |
| 2007/0102838 A1* | 5/2007 | Simon | B82Y 10/00 264/40.1 |

(Continued)

FOREIGN PATENT DOCUMENTS

| JP | 2007019466 A | 1/2007 |
|---|---|---|
| JP | 2010076300 A | 4/2010 |

(Continued)

OTHER PUBLICATIONS

Office Action issued in Japanese Patent Application No. 2014-145382 dated Aug. 28, 2017.

(Continued)

*Primary Examiner* — Michael N Orlando
*Assistant Examiner* — Christian Roldan
(74) *Attorney, Agent, or Firm* — Rossi, Kimms & McDowell LLP

(57) ABSTRACT

The present invention provides an imprint apparatus comprising a plurality of processing devices configured to perform imprint processes for a plurality of substrates in parallel, and a controller configured to control the plurality of processing devices, wherein the controller is configured to control the plurality of processing devices so that each of the plurality of processing devices performs imprint processes for a plurality of regions whose positions correspond to each other over the plurality of substrates, and so that the (Continued)

plurality of processing devices respectively perform imprint processes for a plurality of regions whose positions are different from each other and which have shapes corresponding to each other in a single substrate.

20 Claims, 9 Drawing Sheets

(56) References Cited

U.S. PATENT DOCUMENTS

| | | | |
|---|---|---|---|
| 2007/0200276 A1* | 8/2007 | Mackey | B82Y 10/00 |
| | | | 264/293 |
| 2010/0031833 A1* | 2/2010 | Kasumi | B82Y 10/00 |
| | | | 101/4 |
| 2014/0027955 A1 | 1/2014 | Wakabayashi et al. | |
| 2015/0022793 A1* | 1/2015 | Koga | G03F 7/70483 |
| | | | 355/53 |
| 2016/0009020 A1* | 1/2016 | Takakuwa | H01L 21/0273 |
| | | | 264/293 |

FOREIGN PATENT DOCUMENTS

| | | |
|---|---|---|
| JP | 2011520641 A | 7/2011 |
| JP | 2013161816 A | 8/2013 |
| JP | 2013222728 A | 10/2013 |
| JP | 2016021544 A | 2/2016 |
| TW | 201008759 A1 | 3/2010 |
| TW | 201404574 A | 2/2014 |
| TW | 201408472 A | 3/2014 |

OTHER PUBLICATIONS

Office Action issued in Taiwanese Appln. No. 104121692 dated Feb. 22, 2017. English translation provided.

* cited by examiner

IMPRINT APPARATUS, AND METHOD OF MANUFACTURING ARTICLE

BACKGROUND OF THE INVENTION

Field of the Invention

The present invention relates to an imprint apparatus, and a method of manufacturing an article.

Description of the Related Art

An imprint apparatus that performs an imprint process, which forms an imprint material on a substrate using a mold, in each of a plurality of regions formed on the substrate is garnering attention as an example of a lithography device for mass-producing magnetic storage media, semiconductor devices, and so on. To improve the throughput of the imprint apparatus, the imprint process may be performed by a plurality of processing devices in parallel. In such an imprint apparatus that has a plurality of processing devices, the imprint processes for a plurality of regions in a single substrate can typically be performed by a single processing device.

Characteristics such as overlay precision can sometimes vary due to manufacturing error, control error, and so on in the plurality of processing devices. Accordingly, when the imprint processes for the plurality of regions formed in a single substrate are performed by a single processing device, differences can arise, from substrate to substrate, in the overlay precision at regions located at the same positions on the substrates.

Japanese Patent Laid-Open No. 2007-19466 proposes an imprint apparatus that uses different processing devices for a region located in a central portion of a substrate and a region located in a peripheral portion of the substrate. However, Japanese Patent Laid-Open No. 2007-19466 does not mention using a plurality of processing devices to perform imprint processes in a plurality of regions having the same shape (a plurality of regions located in the central portion of the substrate, for example).

SUMMARY OF THE INVENTION

The present invention provides, for example, an imprint apparatus advantageous in uniformity of overlay precision with respect to a plurality of substrates processed in parallel.

According to one aspect of the present invention, there is provided an imprint apparatus comprising: a plurality of processing devices configured to perform imprint processes for a plurality of substrates in parallel; and a controller configured to control the plurality of processing devices, wherein the controller is configured to control the plurality of processing devices so that each of the plurality of processing devices performs imprint processes for a plurality of regions whose positions correspond to each other over the plurality of substrates, and so that the plurality of processing devices respectively perform imprint processes for a plurality of regions whose positions are different from each other and which have shapes corresponding to each other in a single substrate.

Further features of the present invention will become apparent from the following description of exemplary embodiments (with reference to the attached drawings).

DESCRIPTION OF THE EMBODIMENTS

Figure 1:
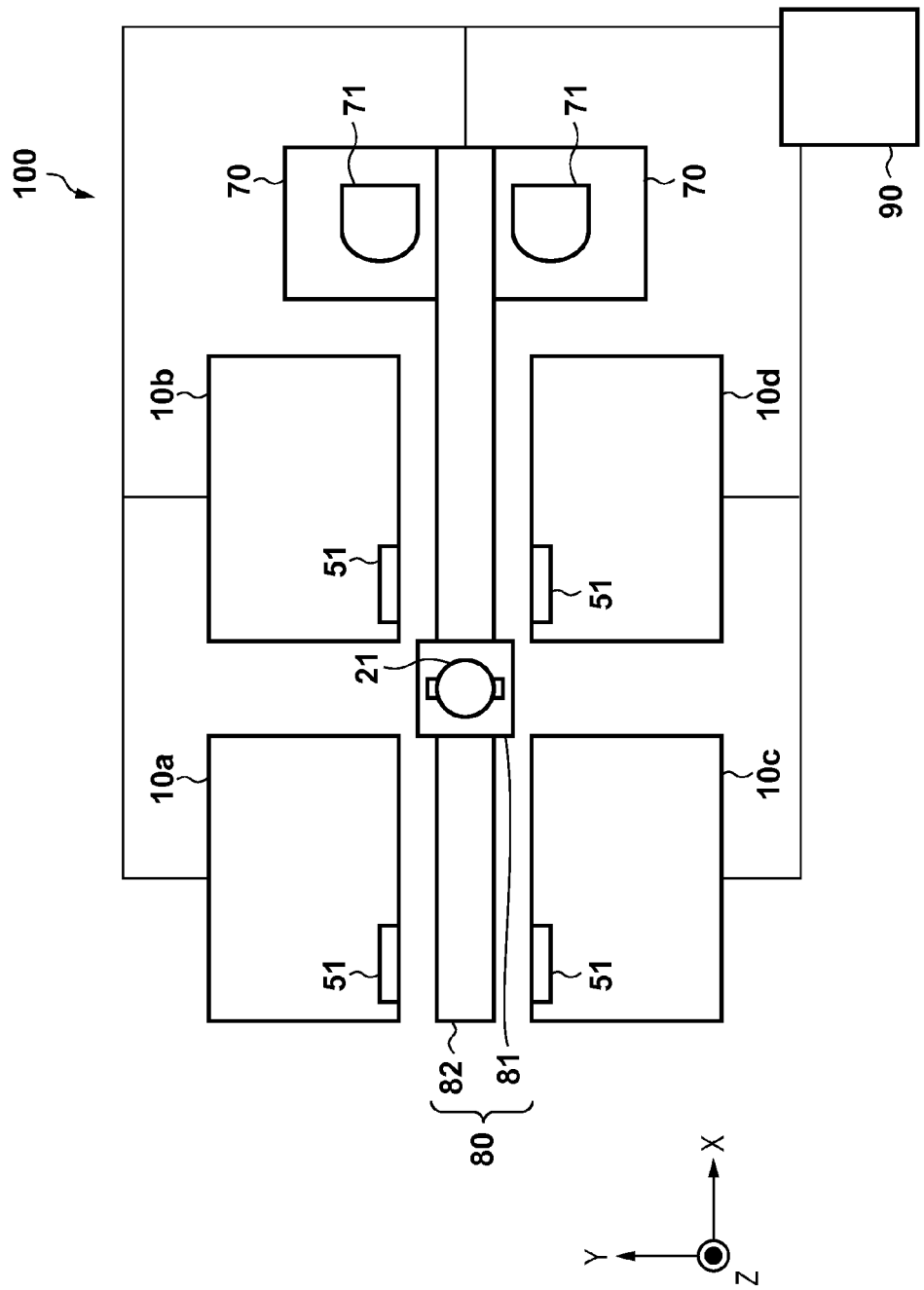
FIG. 1 is a schematic diagram illustrating the configuration of an imprint apparatus according to a first embodiment.

Exemplary embodiments of the present invention will be described below with reference to the accompanying drawings. Note that the same reference numerals denote the same members throughout the drawings, and repetitive descriptions thereof will not be given.

First Embodiment

An imprint apparatus 100 according to a first embodiment of the present invention will be described with reference to FIG. 1. FIG. 1 is a schematic diagram illustrating the configuration of the imprint apparatus 100 according to the first embodiment. The imprint apparatus 100 according to the first embodiment is a cluster-type imprint apparatus having a plurality of processing devices 10 that each performs an imprint process for forming an imprint material on a substrate using a mold in which a pattern is formed. The imprint apparatus 100 includes, for example, the plurality of processing devices 10 that each performs the imprint process, a placement platform 70 on which a carrier 71 storing a plurality of substrates 21 is placed, a conveying device 80 that conveys the substrates 21, and a controller 90. The controller 90 is constituted by a computer including a CPU, a memory, and the like, for example, and controls the imprint processes performed by the respective processing devices 10 and the conveying of the substrates 21 by the conveying device 80. Although the first embodiment describes an example in which the imprint apparatus 100 includes four processing devices 10 (a first processing device 10a, a second processing device 10b, a third processing device 10c, and a fourth processing device 10d), the apparatus may include two, three, or five or more processing devices 10. Here, the conveying device 80 includes, for example, a conveying arm 81 that holds the substrates 21 and a conveying drive device 82 that drives the conveying arm 81 between the placement platform 70 and the respective processing devices 10, and conveys the substrates 21 stored in the carrier 71 on the placement platform 70 to the respective processing devices 10. For example, the conveying device 80 holds the substrates 21 stored in the carrier 71 on the placement platform 70 using the conveying arm 81, and moves the conveying arm 81 to in front of the processing devices 10 to which the substrates 21 are to be conveyed using the conveying drive device 82. The conveying device 80 then delivers the substrates 21 from the conveying arm 81 to an arm 52 of each processing device 10 via a delivery port 51 in each processing device 10.

Figure 2:
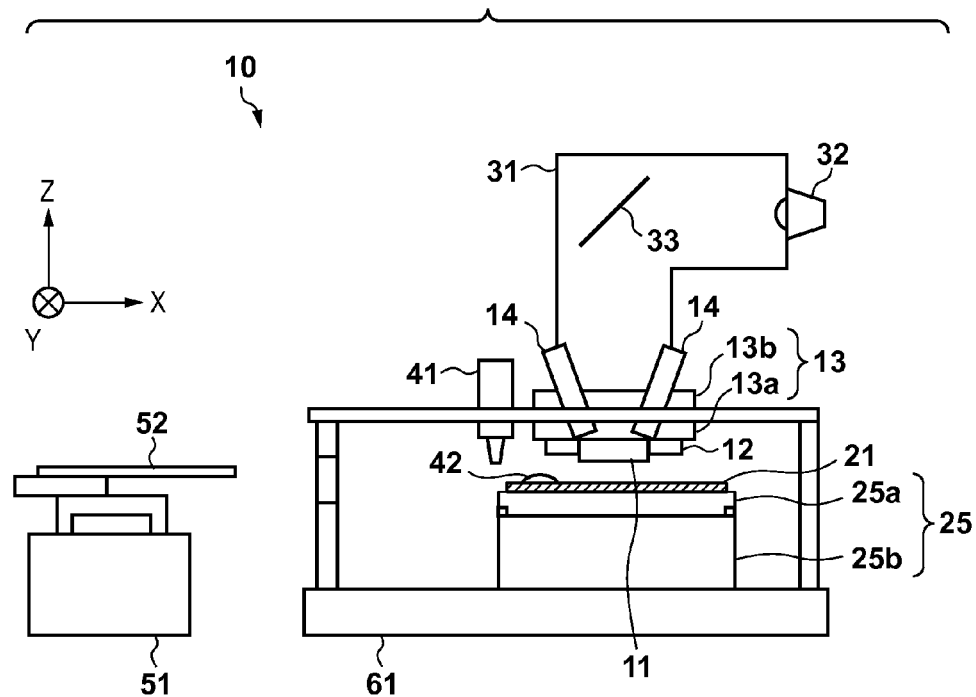
FIG. 2 is a schematic diagram illustrating the configuration of a processing device.

The configuration of each processing device 10 will be described with reference to FIG. 2. FIG. 2 is a schematic diagram illustrating the configuration of the processing device 10. Each processing device 10 cures an imprint material 42 (a resin) on a substrate in a state where a mold 11 in which a pattern is formed has been brought into contact with the imprint material on the substrate. Then, by widening an interval between the mold 11 and the substrate 21 and separating the mold 11 from the cured imprint material 42, the processing device 10 can form a pattern on the substrate from the imprint material. A heat cycle method that uses heat and a photo-curing method that uses light are examples of methods for curing the imprint material, and the first embodiment describes an example in which the photo-curing method is employed. The photo-curing method is a method in which an uncured ultraviolet-curing resin is supplied to the top of the substrate as the imprint material, the mold 11 is brought into contact with the imprint material, and the imprint material is cured by irradiating the imprint material with ultraviolet light in the state of contact.

Each processing device 10 can include, for example, a substrate stage 25 (a holder) that holds the substrate 21, a mold holding device 13 that holds the mold 11, a measuring device 14, an irradiating device 31, and a supply device 41. Each processing device 10 can also include the arm 52 that places the substrate 21, which has been delivered from the conveying arm 81 via the delivery port 51, upon the substrate stage 25. Although the first embodiment describes the imprint process in each processing device 10 as being controlled by the controller 90, individual controllers that control the imprint processes in the respective processing devices 10 may be provided in those processing devices 10.

A single-crystal silicon substrate, an SOI (Silicon on Insulator) substrate, or the like is used for the substrate 21. The imprint material 42 (an ultraviolet-curing resin) is supplied to the top surface of the substrate 21 (a processing target surface) by the supply device 41, which will be described later. Meanwhile, the mold 11 is normally made from a material that can transmit ultraviolet light, such as silica, and a pattern with concave and convex portions (a pattern with unevenness), which is to be transferred to the substrate 21, is formed in a partial region (a pattern region 11a) of the surface of the mold located on the substrate side.

The substrate stage 25 can include a substrate chuck 25a that holds the substrate 21 using a holding force (attracting force) such as vacuum suction, static electricity, or the like, and a substrate drive device 25b configured to be capable of mechanically holding and moving the substrate chuck 25a on a base plate 61. The substrate chuck 25a may be configured to be capable of individually changing holding forces for holding multiple parts of the substrate 21. By configuring the substrate chuck 25a in this manner, when the mold 11 is separated from the cured imprint material 42 in a region formed on the substrate 21, it is possible to reduce only the holding force used for holding the part that includes that region. As a result, that region takes on a shape that protrudes toward the mold 11 when the mold 11 is separated. Accordingly, the mold 11 can be separated from the cured imprint material 42 with ease, and the occurrence of defects in the pattern formed by the imprint material can be suppressed. Meanwhile, the substrate drive device 25b may be configured to be mobile in an X direction, a Y direction, and a ωZ direction (a direction of rotation around a Z axis) on the base plate 61, and may be configured to be further mobile in a Z direction, a ωX direction (a direction of rotation around an X axis), and a ωY direction (a direction of rotation around a Y axis).

The mold holding device 13 can include a mold chuck 13a that holds the mold using vacuum suction, static electricity, or the like, and a mold drive device 13b that drives the mold chuck 13a in the Z direction, the ωX direction, and the ωY direction. The mold chuck 13a and the mold drive device 13b each has an open region in a central portion (on an inner side) thereof, and are configured so that the substrate 21 is irradiated with the light emitted from the irradiating device 31 via the mold 11. Meanwhile, the mold drive device 13b includes an actuator such as a linear motor, an air cylinder, or the like, and drives the mold chuck 13a (the mold 11) in the Z direction so as to bring the mold 11 into contact with and separate the mold 11 from the imprint material 42 on the substrate. Because it is necessary to drive the mold 11 with a high level of precision when bringing the mold 11 into contact with and separating the mold 11 from the imprint material 42 on the substrate, the mold drive device 13b may be constituted by a plurality of drive systems such as a coarse drive system and a fine drive system. Although operations for changing an interval between the substrate 21 and the mold 11 are performed by the mold drive device 13b in the imprint apparatus 100 according to the first embodiment, these operations may be performed by the substrate stage 25, or may be performed by both in a relative manner.

Figure 3:
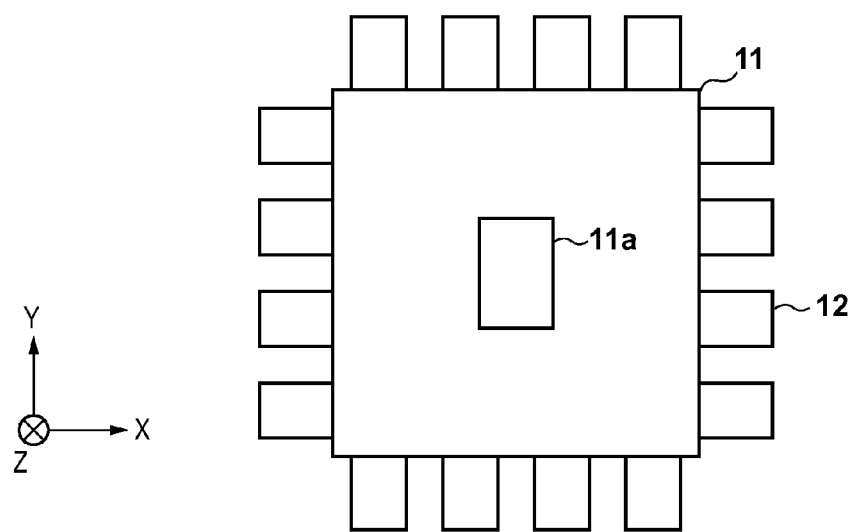
FIG. 3 is a diagram illustrating the configuration of a correction device.

There are cases where deformities including components such as a magnification component, a trapezoid component, and so on occur in the pattern region 11a in the mold due to manufacturing error, thermal deformation, or the like. Accordingly, the mold holding device 13 includes a correction device 12 that corrects deformations in the pattern region 11a by applying a force to a side face of the mold 11 at a plurality of positions thereof. FIG. 3 is a diagram illustrating the configuration of the correction device 12 that corrects deformations in the pattern region 11a in the mold, and is a diagram illustrating the mold 11 from below (from a −Z direction). The correction device 12 includes a plurality of actuators, and in the example illustrated in FIG. 3, four actuators are provided on each side of the mold 11. Deformations in the pattern region 11a in the mold can be corrected by the respective actuators individually applying forces to the side faces of the mold 11. Linear motors, air cylinders, piezoelectric actuators, or the like can be used as the actuators in the correction device 12.

The irradiating device 31 irradiates the imprint material 42 on the substrate with light (ultraviolet light) via the mold 11 in order to cure the imprint material 42 on the substrate. The irradiating device 31 can include, for example, a light source 32 that emits light (ultraviolet light) to cure the imprint material 42 on the substrate, and an optical element 33 that adjusts the light emitted from the light source 32 to a light suited to the imprint process. Meanwhile, the supply device 41 supplies (spreads) the imprint material (uncured resin) onto the substrate. As described above, in the first embodiment, an ultraviolet-curing resin having a property in which the resin is cured by being irradiated with ultraviolet light is used as the imprint material. However, the imprint material is not limited thereto, and the type of the imprint material supplied from the supply device 41 onto the substrate can be selected as appropriate based on the various types of conditions in the process for manufacturing the semiconductor device. The amount of imprint material ejected from an ejecting nozzle of the supply device 41 can be determined as appropriate by considering the thickness, density, and so on of the pattern to be formed by the imprint material. A wavelength of the light emitted from the light source 32 can also be determined as appropriate based on the type of the imprint material.

The measuring device 14 measures relative positions of a region formed on the substrate and the pattern region 11a in the mold. For example, a plurality of alignment marks (called "marks" hereinafter) are provided in both a region on the substrate and the pattern region 11a in the mold. The measuring device 14 includes a plurality of scopes, and each scope detects a mark in the region on the substrate and a mark in the pattern region 11a. Through this, the measuring device 14 can measure the relative positions of the region on the substrate and the pattern region 11a in the mold based on results of detecting the marks in the region on the substrate and the marks in the pattern region 11a as detected by each scope.

Imprint Processing Performed by Each Processing Device

Figure 4A:
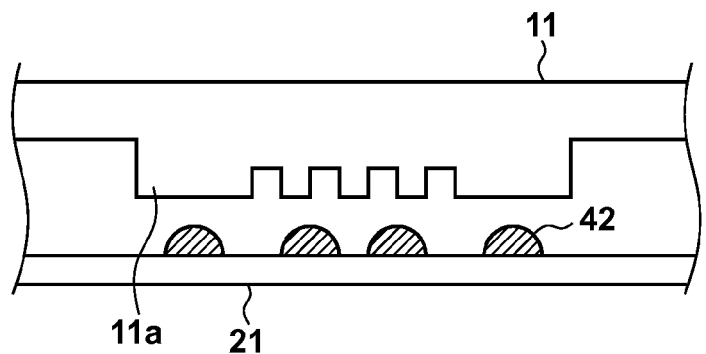
FIG. 4A is a diagram illustrating an imprint process performed by each processing device.
Figure 4B:
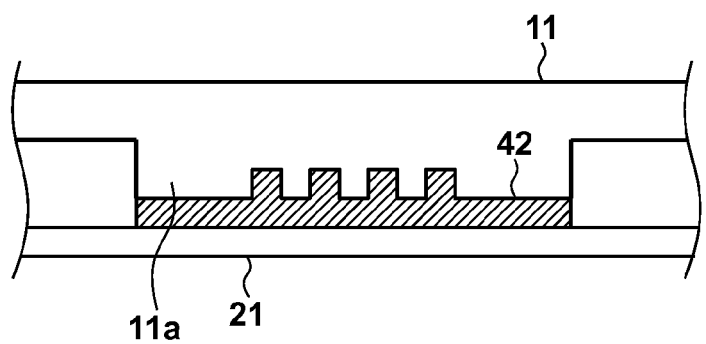
FIG. 4B is a diagram illustrating an imprint process performed by each processing device.
Figure 4C:
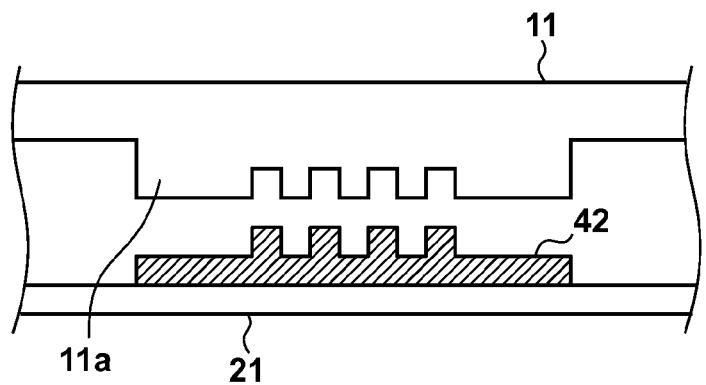
FIG. 4C is a diagram illustrating an imprint process performed by each processing device.

Next, the imprint process performed by each processing device 10 will be described with reference to FIGS. 4A to 4C. First, the controller 90 controls the substrate stage 25 so that a target region on the substrate to which the pattern in the mold 11 is to be transferred (a region on which the imprint process is to be performed, for example) is located below the supply device 41. When the target region is located below the supply device 41, the controller 90 controls the supply device 41 to supply the imprint material 42 (the uncured resin) upon the target region. After the imprint material 42 has been supplied to the target region, the controller 90 controls the substrate stage 25 so that the target region is located below the pattern region 11a in the mold. A positional relationship between the mold 11 and the substrate 21 at this time is the positional relationship illustrated in FIG. 4A.

Once the target region is located below the pattern region 11a in the mold, the controller 90 controls the mold holding device 13 so as to narrow the interval between the mold 11 and the substrate 21 and bring the mold 11 into contact with the imprint material 42 on the substrate. After the interval between the mold 11 and the substrate 21 has dropped to a target range, the controller 90 causes the measuring device 14 to measure the relative positions of the pattern region 11a and the target region by detecting the marks in the pattern region 11a and the marks in the target region. The controller 90 then drives the substrate stage 25, the mold holding device 13, and so on based on the result of the measurement performed by the measuring device 14, and positions the pattern region 11a in the mold relative to the target region. The positional relationship between the mold 11 and the substrate 21 at this time is the positional relationship illustrated in FIG. 4B.

The controller 90 allows a predetermined time period to pass while the mold 11 is in contact with the imprint material 42 on the substrate. Through this, the imprint material 42 on the substrate can fill the entirety of the pattern in the mold 11. Once the predetermined time period has passed after the mold 11 has been brought into contact with the imprint material 42 on the substrate, the controller 90 controls the irradiating device 31 to irradiate the imprint material 42 on the substrate with light (ultraviolet light) through the mold 11. The controller 90 then controls the mold holding device 13 so that the mold 11 moves in the +Z direction, and separates the mold 11 from the imprint material 42 on the substrate. The positional relationship between the mold 11 and the substrate 21 at this time is the positional relationship illustrated in FIG. 4C. Through this, the pattern in the mold 11 can be transferred to the imprint material 42 on the substrate.

Imprint Method

With an imprint apparatus having a plurality of processing devices 10 in this manner, the imprint processes for a plurality of regions 22 formed on a single substrate 21 can generally be performed by a single processing device 10. In the case where different processing devices 10 are used between the regions 22 located in a central portion of the substrate 21 and the regions 22 located in a peripheral portion of the substrate 21, the imprint processes for the plurality of regions 22 located in the central portion of the substrate 21 can be performed by a single processing device 10. However, there is variation in characteristics such as overlay precision due to manufacturing error, control error, and so on in the plurality of processing devices 10. Accordingly, when the imprint processes for the single substrate 21 are performed by a single processing device 10, differences can arise, from substrate to substrate in the plurality of substrates 21, in the overlay precision at the regions 22 located at the same positions on the substrates.

Accordingly, the imprint apparatus 100 according to the first embodiment uses the plurality of processing devices 10 to perform the imprint processes for the plurality of regions 22 formed in the single substrate 21 in parallel (in a shared manner). The imprint apparatus 100 then causes the same processing device 10 to perform the imprint processes for the regions 22 located in the same position of each substrate in the plurality of substrates 21. In other words, the imprint apparatus 100 according to the first embodiment causes the plurality of processing devices 10 to respectively perform imprint processes for the plurality of regions 22 whose positions are different from each other and which have shapes corresponding to each other in a single substrate 21. Each of the plurality of processing devices 10 is then caused to perform imprint processes on the corresponding plurality of regions 22 located at the same positions over a plurality of substrates 21. Here, "the plurality of regions 22 which have shapes corresponding to each other" refers to a plurality of regions designed to have shapes that are the same as each other, and can include cases where the plurality of regions 22 formed in the substrate actually do not have exactly the same shapes. Likewise, "located at the same positions over a plurality of substrates 21" refers to positions designed to be the same over the plurality of substrates 21, and can include cases where the positions of the regions 22 formed on the substrates are actually not exactly the same through the plurality of substrates 21.

Figure 5:
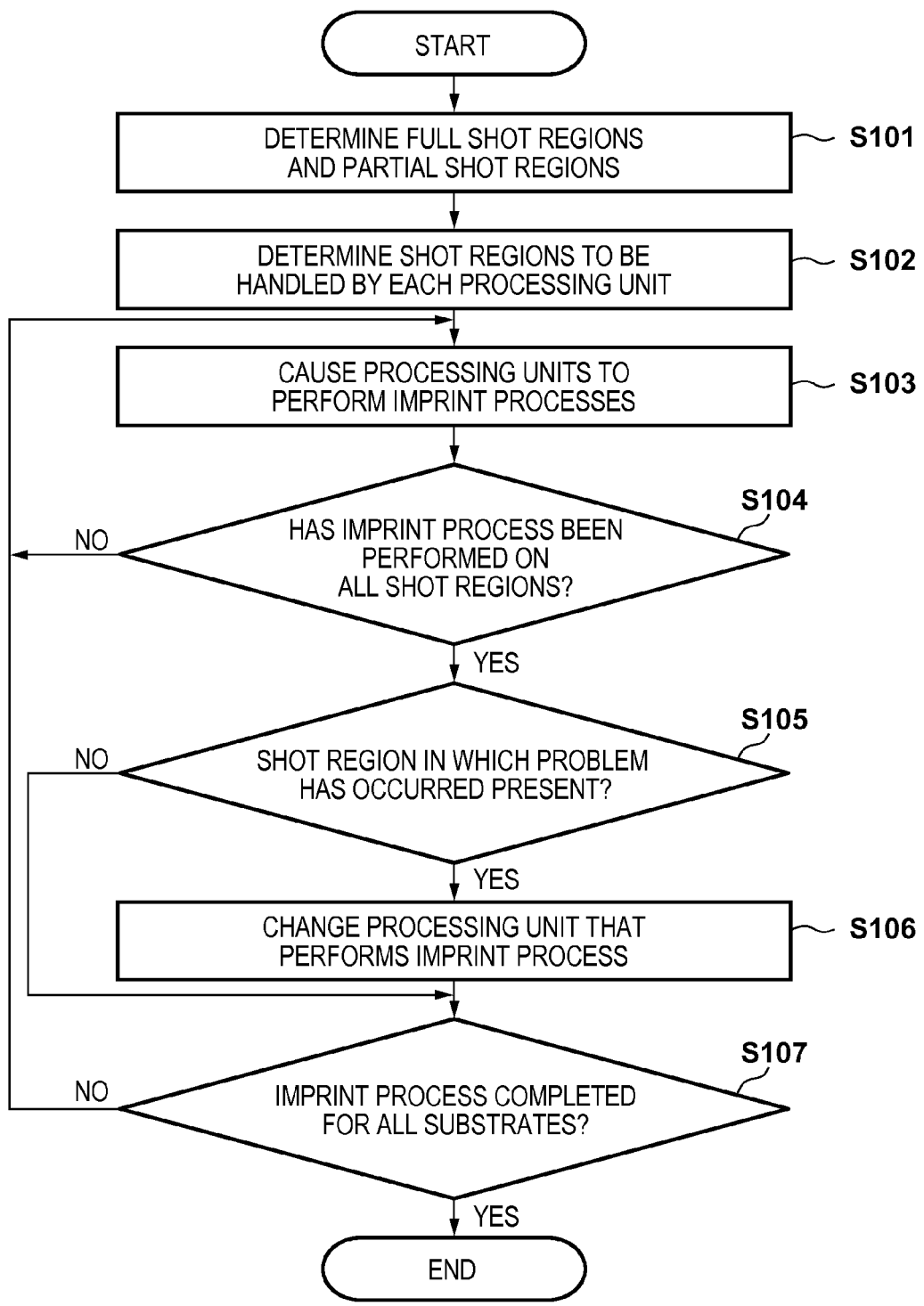
FIG. 5 is a flowchart illustrating an imprint method performed by the imprint apparatus according to the first embodiment.

Next, an imprint method performed using the imprint apparatus 100 according to the first embodiment will be described with reference to FIG. 5. FIG. 5 is a flowchart illustrating an imprint method performed by the imprint apparatus 100 according to the first embodiment. The first embodiment describes a case where each of the plurality of processing devices 10 has the same configuration. The configuration of the processing device 10 can include at least one of a number of regions on which the imprint process can be performed in one batch (that is, the shape of the pattern region in the mold) and the shape of the substrate chuck 25a (a holding device) that holds the substrate 21. Meanwhile, it is assumed that the arrangement of the plurality of regions on which the imprint process is performed is the same over the plurality of substrates.

Figure 6A:
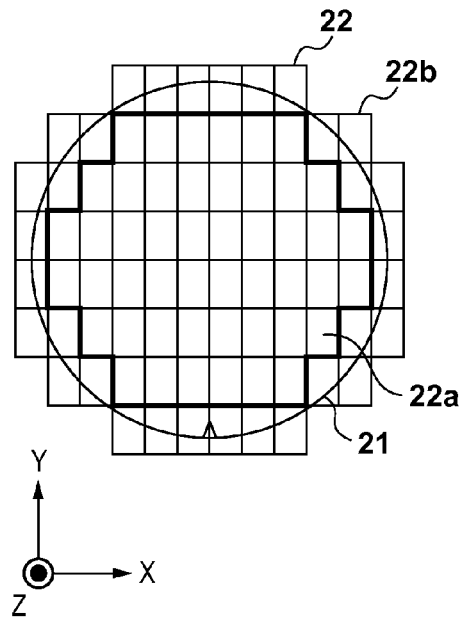
FIG. 6A is a diagram illustrating a layout of a plurality of regions formed on a substrate.

In S101, the controller 90 determines, from the plurality of processing devices 10, the processing devices 10 that are to perform the imprint process on full shot regions 22a and the processing devices 10 that are to perform the imprint process on partial shot regions 22b. The full shot regions 22a are rectangular regions 22 located in the central portion of the substrate 21 and that do not contain the outer periphery of the substrate 21, whereas the partial shot regions 22b are non-rectangular regions 22 located in the peripheral portion of the substrate 21 and that do contain the outer periphery of the substrate 21. FIG. 6A is a diagram illustrating a layout of the plurality of regions 22 formed on a single substrate 21. In FIG. 6A, the regions 22 located within the bold lines are the full shot regions 22a, whereas the regions 22 located outside the bold lines are the partial shot regions 22b. In the first embodiment, the controller 90 determines that the first processing device 10a and the second processing device 10b are the processing devices 10 that perform the imprint process on the full shot regions 22a. Likewise, the third processing device 10c and the fourth processing device 10d are determined as the processing devices 10 that perform the imprint process on the partial shot regions 22b.

In S102, the controller 90 determines the regions 22 on which each processing device 10 is to perform the imprint process (assigned regions). The controller 90 determines a plurality of full shot regions 22a on which the imprint process is to be performed by the first processing device 10a (first regions $22a_1$) and a plurality of full shot regions 22a on which the imprint process is to be performed by the second processing device 10b (second regions $22a_2$). At this time, the controller 90 may control the plurality of processing devices 10 so that a difference in the time period required to perform the imprint process on a single substrate is within a range of tolerance among the plurality of processing devices 10. In other words, the controller 90 may determine the assigned regions so that a difference between the time in which the first processing device 10a performs the imprint process on a single substrate 21 and the time in which the second processing device 10b performs the imprint process on a single substrate 21 falls within a range of tolerance. For example, the controller 90 may control the plurality of processing devices 10 so that a difference in the number of regions on which the imprint process is to be performed on a single substrate 21 is within a range of tolerance among the plurality of processing devices 10. In other words, the controller 90 may determine the assigned regions so that there is the same number of first regions $22a_1$ and second regions $22a_2$ in a single substrate 21. In addition, the controller 90 may control the plurality of processing devices 10 so that a difference in the moving amount of the substrate 21 necessary for carrying out the imprint process on a single substrate 21 is within a range of tolerance among the plurality of processing devices 10. In other words, the controller 90 may determine the assigned regions so that a moving amount of the substrate 21 while the first processing device 10a performs the imprint process on a single substrate 21 is the same as a moving amount of the substrate 21 while the second processing device 10b performs the imprint process on a single substrate 21.

Meanwhile, the controller 90 determines partial shot regions 22b on which the imprint process is to be performed by the third processing device 10c (third regions $22b_1$) and partial shot regions 22b on which the imprint process is to be performed by the fourth processing device 10d (fourth regions $22b_2$). At this time, the controller 90 may determine these assigned regions so that a difference between the time in which the third processing device 10c performs the imprint process on a single substrate 21 and the time in which the fourth processing device 10d performs the imprint process on a single substrate 21 falls within a range of tolerance. For example, the controller 90 may determine the assigned regions so that there is the same number of third regions $22b_1$ and fourth regions $22b_2$ in a single substrate 21. Likewise, the controller 90 may determine the assigned regions so that a moving amount of the substrate 21 while the third processing device 10c performs the imprint process on a single substrate 21 is the same as a moving amount of the substrate 21 while the fourth processing device 10d performs the imprint process on a single substrate 21.

Figure 6B:
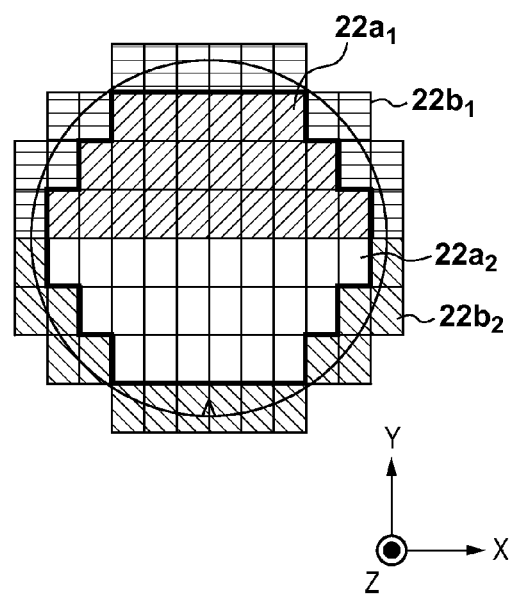
FIG. 6B is a diagram illustrating a layout of a plurality of regions formed on a substrate.

FIG. 6B is a diagram illustrating the processing devices 10 that perform the imprint processes in the layout of the plurality of regions 22. In the example illustrated in FIG. 6B, of the plurality of full shot regions 22a arranged within the bold line, the full shot regions 22a on the +Y direction side are taken as the first regions $22a_1$ and the full shot regions 22a on the −Y direction side are taken as the second regions $22a_2$. Meanwhile, of the plurality of partial shot regions 22b on the outside of the bold line, the partial shot regions 22b on the +Y direction side are taken as the third regions $22b_1$ and the partial shot regions 22b on the −Y direction side are taken as the fourth regions $22b_2$. Note that the diagram in FIG. 6B is merely an example, and the present invention is not intended to be limited thereto. For example, the processing devices 10 that handle the imprint processes for the plurality of full shot regions 22a and the plurality of partial shot regions 22b may be split between the +X direction side and the −X direction sides instead.

In S103, the controller 90 conveys the substrate 21 to the respective processing devices 10 using the conveying device 80, and causes the respective processing devices 10 to perform the imprint processes on their assigned regions in the substrate 21 that has been conveyed. In S104, the controller 90 determines whether or not the imprint process has been performed on all of the regions 22 in the substrate. The process moves to S105 in the case where the imprint process has been performed on all of the regions 22. However, in the case where the imprint process has not been performed on all of the regions 22, the process returns to S103 and the controller 90 uses the conveying device 80 to convey the substrate 21 to the processing device 10 that handles the imprint process for the regions 22 on which the imprint process has not been performed. The controller 90 then causes the processing device 10 to perform the imprint process on the assigned region.

For example, the controller 90 controls the conveying device 80 so as to transport the substrate 21 on which the imprint process is to be performed (a target substrate) to the first processing device 10a, and causes the first processing device 10a to perform the imprint process on the first regions $22a_1$ in the target substrate. Once the imprint process for the first regions $22a_1$ in the target substrate has ended, the controller 90 controls the conveying device 80 to convey the target substrate to the second processing device 10b, and causes the second processing device 10b to perform the imprint process on the second regions $22a_2$ in the target substrate. Likewise, once the imprint process for the second regions $22a_2$ in the target substrate has ended, the controller 90 causes the third processing device 10c to perform the imprint process on the third regions $22b_1$ in the target substrate and causes the fourth processing device 10d to perform the imprint process on the fourth regions $22b_2$. With the imprint apparatus 100 according to the first embodiment, the imprint process is performed on all of the regions 22 formed in a single substrate 21 by the respective processing devices 10 carrying out the imprint process on their assigned regions. This process is then performed on each of the plurality of substrates 21. At this time, the controller 90 may control the plurality of processing devices 10 so that the imprint processes on the plurality of substrates 21 are performed in parallel, or in other words, so that the plurality of processing devices 10 perform their imprint processes on mutually-different substrates 21 in parallel.

In S105, the controller 90 determines whether or not a region 22 in which a problem (a patterning error) has occurred is present in the substrate 21 whose imprint process has been completed. "Problem" can include, for example, at least one of the adherence of a foreign substance (foreign particles), pattern defects, and overlay error greater than or equal to a threshold. The adherence of a foreign substance, pattern defects, and overlay error may be measured by the measuring device 14 provided in the imprint apparatus 100, or may be measured by a measuring apparatus provided outside of the imprint apparatus 100. The process advances to S106 in the case where there is a problem in the substrate, whereas the process advances to S107 in the case where there is no problem in the substrate.

Figure 6C:
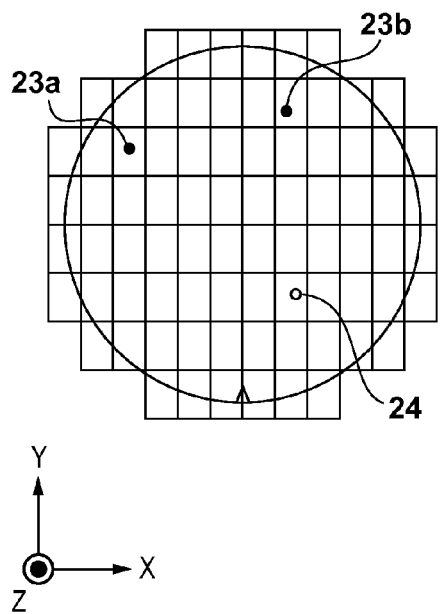
FIG. 6C is a diagram illustrating a layout of a plurality of regions formed on a substrate.
Figure 6D:
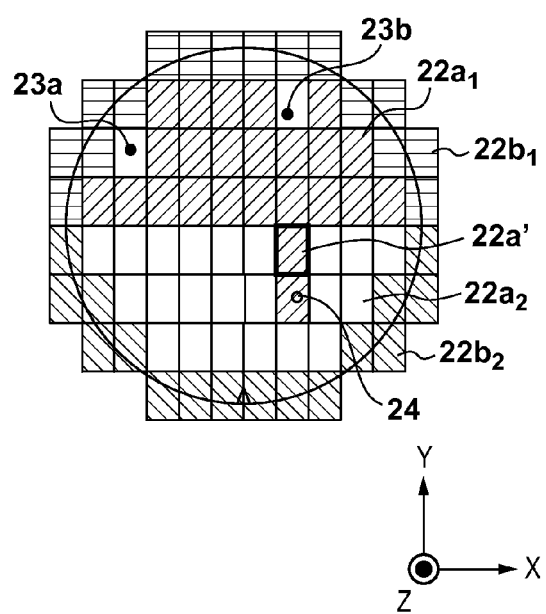
FIG. 6D is a diagram illustrating a layout of a plurality of regions formed on a substrate.

In S106, the controller 90 changes the processing device 10 that performs the imprint process on the region located in the same position as the region 22 in which the problem occurred for the substrates on which the imprint process is performed after the substrate 21 in which the problem (the patterning error) occurred. The changing of the processing device 10 will be described hereinafter with reference to FIG. 6C and FIG. 6D. FIG. 6C is a diagram illustrating the layout of the plurality of regions 22 in the substrate 21 for which the imprint process has been completed, and FIG. 6D is a diagram illustrating the processing devices 10 that perform the imprint processes for the layout of the plurality of regions 22. Assume a case where, as illustrated in FIG. 6C, a foreign substance adheres to positions 23a and 23b of the substrate for which the imprint process has been completed, and overlay error greater than or equal to a threshold has occurred at a position 24 on the substrate. The positions 23a and 23b are within the shot regions determined to be the first regions $22a_1$ on which the first processing device 10a performs the imprint process, whereas the position 24 is within the shot regions determined to be the second regions $22a_2$ on which the second processing device 10b performs the imprint process. In this case, as illustrated in FIG. 6D, the controller 90 changes the region 22 containing the position 23a and the region 22 containing the position 23b to the second regions $22a_2$ on which the second processing device 10b performs the imprint process. Likewise, the controller 90 changes the region 22 containing the position 24 to the first regions $22a_1$ on which the first processing device 10a performs the imprint process. At this time, the processing devices 10 that perform the imprint processes for several of the regions 22 may be changed so that there is the same number of first regions $22a_1$ and second regions $22a_2$. In the example illustrated in FIG. 6D, a full shot region $22a'$ determined to be the second region $22a_2$ in FIG. 6B is changed to the first region $22a_1$. This makes it possible to the same number of first regions $22a_1$ and second regions $22a_2$.

In S107, the controller 90 determines whether or not the imprint process has been performed on all of the substrates 21. The process moves to S104 in the case where the imprint process has not been performed on all of the substrates 21, and ends in the case where the imprint process has been performed on all of the substrates 21.

As described thus far, the imprint apparatus 100 according to the first embodiment uses the plurality of processing devices 10 to perform the imprint processes for the plurality of regions 22 formed in the single substrate 21 in a shared manner. The imprint apparatus 100 can then cause the same processing device 10 to perform the imprint processes for the regions 22 located in the same area of each substrate in the plurality of substrates 21. Through this, differences in the overlay precision among the plurality of substrates 21 can be reduced.

Second Embodiment

Figure 7:
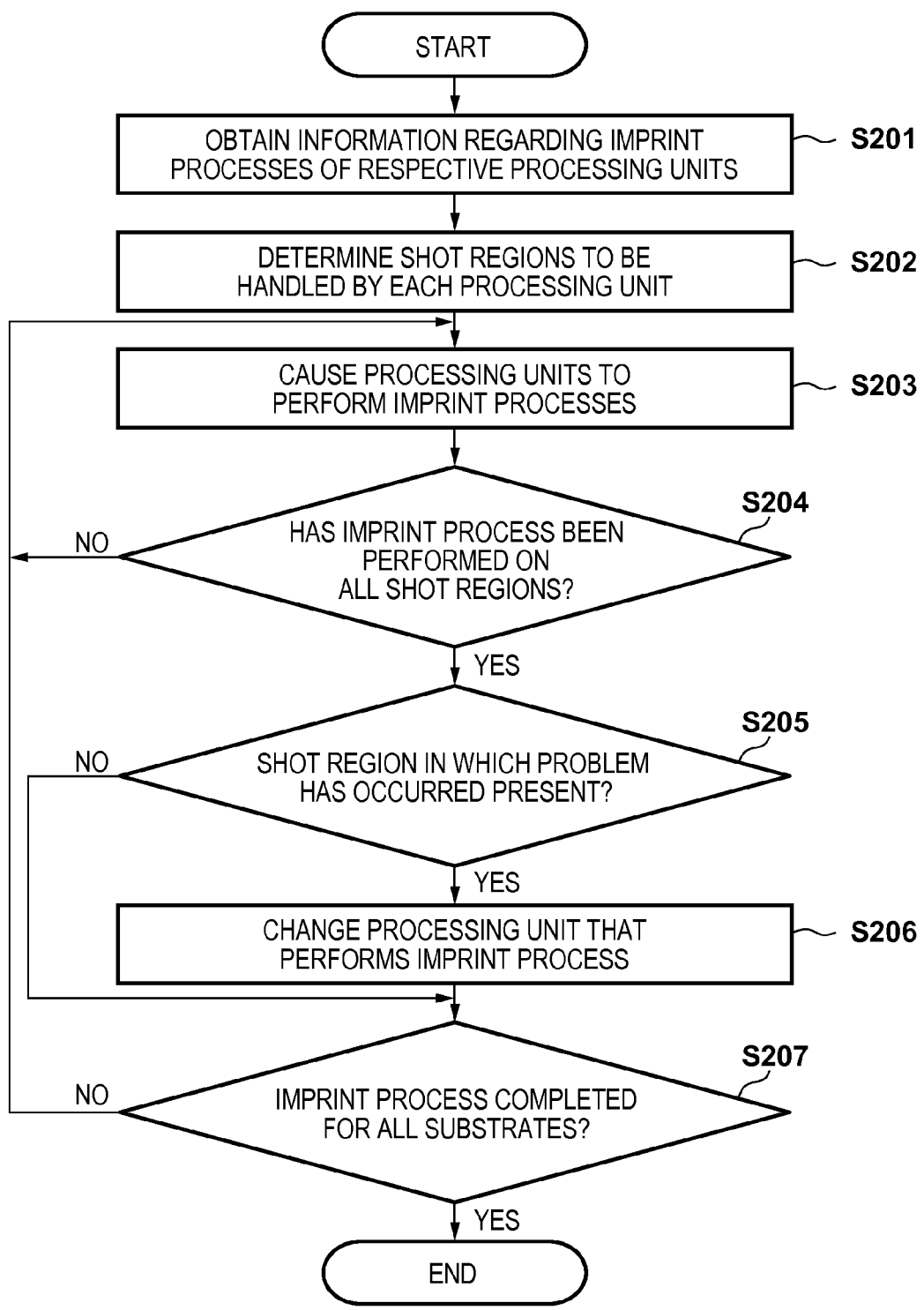
FIG. 7 is a flowchart illustrating an imprint method performed by an imprint apparatus according to a second embodiment.

The first embodiment has described a case where each of the plurality of processing devices 10 has the same configuration. The second embodiment describes a case where the plurality of processing devices 10 have different configurations. The configuration of the processing device 10 can, as mentioned earlier, include at least one of a number of regions 22 in the substrate on which the imprint process can be performed in one batch (that is, the shape of the pattern region 11a in the mold) and the shape of the substrate chuck 25a (the holding device) that holds the substrate 21. Next, an imprint method performed using an imprint apparatus according to the second embodiment will be described with reference to FIG. 7. FIG. 7 is a flowchart illustrating an imprint method performed by an imprint apparatus according to the second embodiment.

In S201, the controller 90 obtains information regarding the imprint processes performed by the respective processing devices 10. The information regarding the imprint processes performed by the processing devices 10 can include, for example, information of a number of regions 22 on which the imprint process can be performed at one time (that is, the shape of the pattern region 11a in the mold), the shape of the substrate chuck 25a (the holding device) that holds the substrate 21, and so on.

Here, the shape of the pattern region 11a in the mold used in each processing device 10 and the shape of the substrate chuck 25a that holds the substrate 21 will be discussed. With an imprint apparatus, there are cases where the shape of the pattern region 11a in the mold, the shape of the substrate chuck 25a, or the like in the plurality of processing devices 10 is varied in order to increase the throughput or reduce defects in the patterns formed from the imprint material.

FIGS. 8A to 8D are diagrams illustrating examples of the shape of the pattern region 11a in the mold. For example, the mold 11 illustrated in FIG. 8A and FIG. 8B has the pattern region 11a configured so that there is one region 22 on the substrate for which the imprint processes can be performed in one batch. In the mold 11 illustrated in FIG. 8A, the pattern region 11a is located in the center, whereas in the mold 11 illustrated in FIG. 8B, the pattern region 11a is shifted from the center in the +X direction. The mold 11 illustrated in FIG. 8C has the pattern region 11a configured so that there are four regions 22 on the substrate for which the imprint processes can be performed in one batch. Meanwhile, the mold 11 illustrated in FIG. 8D has the pattern region 11a configured so that there are three regions 22 on the substrate for which the imprint processes can be performed in one batch. The molds 11 illustrated in FIGS. 8C and 8D can perform the imprint processes for the plurality of regions 22 in the substrate in one batch through a single imprint (this is called "multi-area imprinting"), and thus the throughput can be increased.

FIGS. 9A to 9F are diagrams illustrating examples of the shape of the substrate chuck 25a that holds the substrate 21. The substrate chucks 25a illustrated in FIGS. 9A to 9F are configured to be capable of changing the holding force (a force that attracts the substrate 21) for holding a plurality of parts 92 of the substrate 21 on an individual basis. By configuring the substrate chuck 25a in this manner, when the mold 11 is separated from the cured imprint material in a region formed on the substrate 21, it is possible to reduce only the holding force used for holding the part 92 that includes that region. Accordingly, that region can protrude toward the mold 11 when the mold 11 separates and thus the mold 11 can be separated from the cured imprint material with ease and the occurrence of defects in the pattern formed by the imprint material can be suppressed. For example, assume a case where a processing device 10 having the substrate chuck 25a illustrated in FIG. 9A performs an imprint process on the region 22 in the substrate located at a position 91. In this case, when the mold 11 separates from the imprint material on the region 22, the holding force at a part 92a is reduced beyond the holding force at other parts 93 to 95. Accordingly, when the mold 11 separates from the region 22 in the substrate located at the position 91, that region protrudes toward the mold 11, which makes it easy for the mold 11 to separate from the cured imprint material.

Figure 8A:
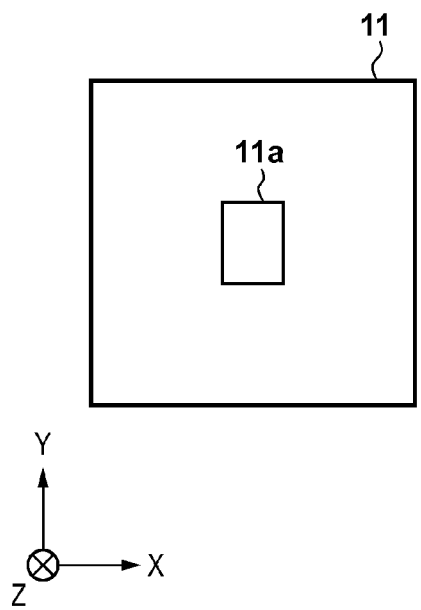
FIG. 8A is a diagram illustrating an example of the shape of a pattern region in a mold.
Figure 8B:
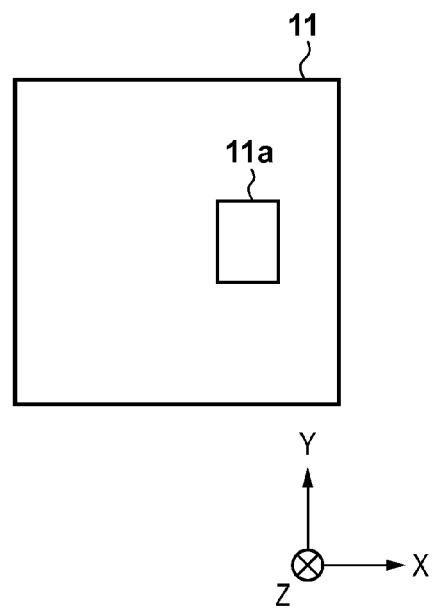
FIG. 8B is a diagram illustrating an example of the shape of a pattern region in a mold.
Figure 8C:
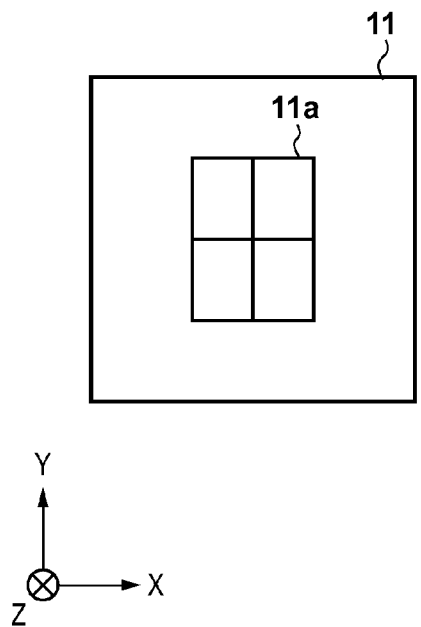
FIG. 8C is a diagram illustrating an example of the shape of a pattern region in a mold.
Figure 8D:
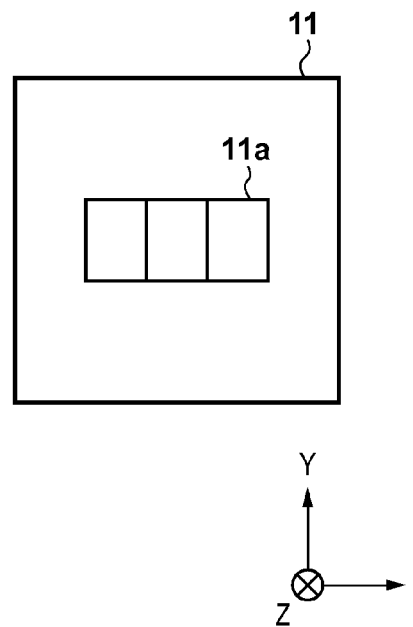
FIG. 8D is a diagram illustrating an example of the shape of a pattern region in a mold.
Figure 9A:
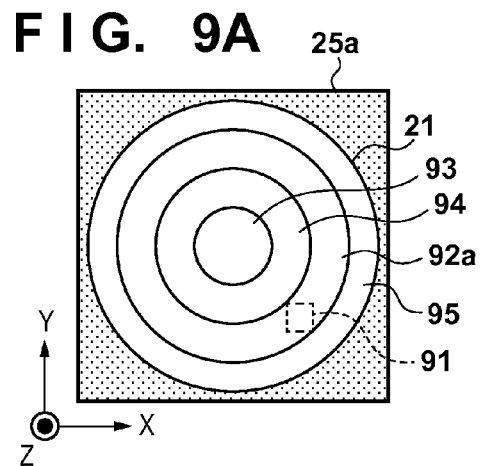
FIG. 9A is a diagram illustrating an example of the shape of a substrate chuck.
Figure 9B:
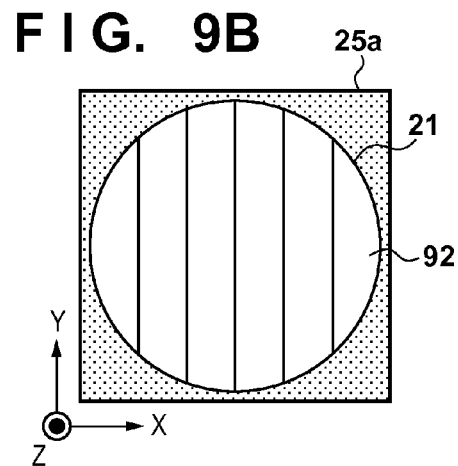
FIG. 9B is a diagram illustrating an example of the shape of a substrate chuck.
Figure 9C:
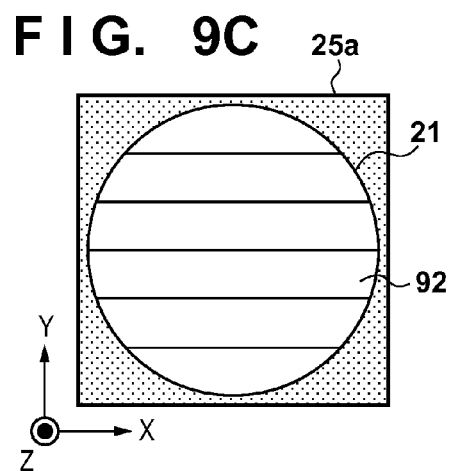
FIG. 9C is a diagram illustrating an example of the shape of a substrate chuck.
Figure 9D:
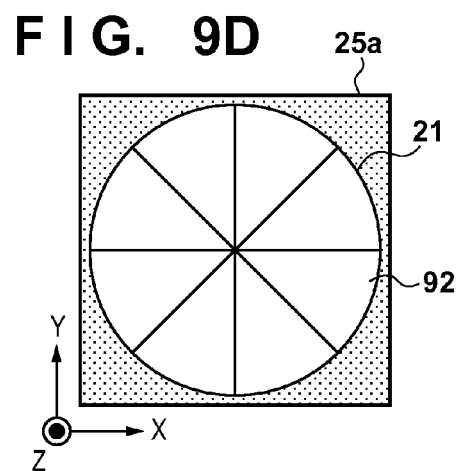
FIG. 9D is a diagram illustrating an example of the shape of a substrate chuck.
Figure 9E:
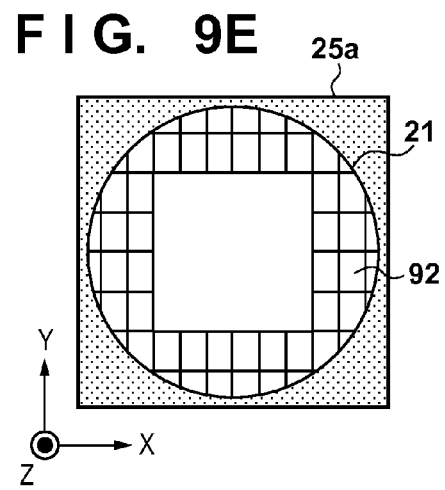
FIG. 9E is a diagram illustrating an example of the shape of a substrate chuck.
Figure 9F:
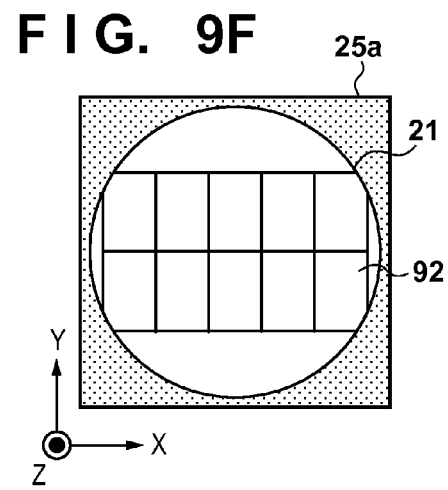
FIG. 9F is a diagram illustrating an example of the shape of a substrate chuck.

In the second embodiment, it is assumed that the first processing device 10a and the second processing device 10b each includes the mold 11 illustrated in FIG. 8A and the substrate chuck 25a illustrated in FIG. 9A. Meanwhile, it is assumed that the third processing device 10c and the fourth processing device 10d includes the mold illustrated in FIG. 8C and the substrate chuck 25a illustrated in FIG. 9D.

Figure 10A:
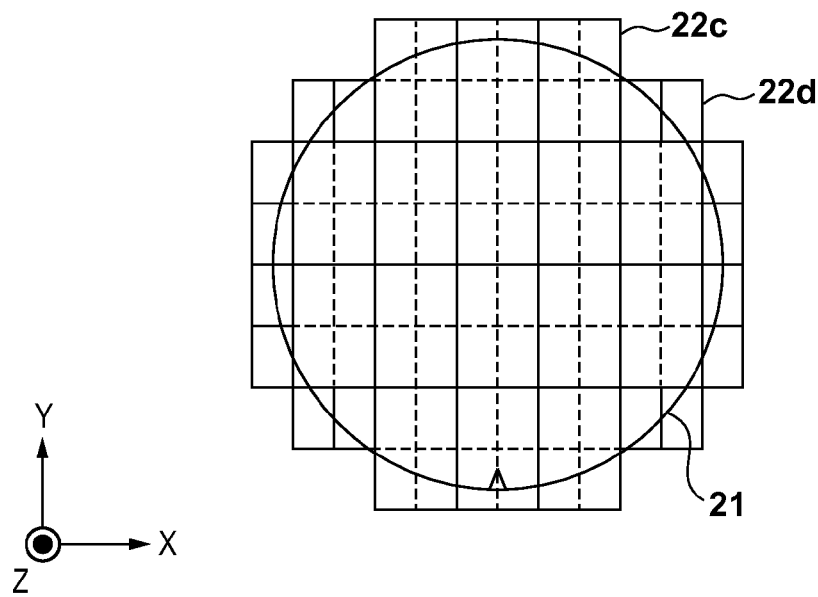
FIG. 10A is a diagram illustrating a layout of multishot regions and single-shot regions.

In S202, the controller 90 determines the regions 22 in the substrate on which each processing device 10 is to perform the imprint process (assigned regions) based on the information obtained in S201. As mentioned above, the first processing device 10a and the second processing device 10b perform the imprint process in one batch on four regions 22. In other words, the first processing device 10a and the second processing device 10b perform multi-imprinting. On the other hand, the third processing device 10c and the fourth processing device 10d perform the imprint process on the one region 22, as mentioned above. Accordingly, for example, the controller 90 groups four regions 22 and determines the successfully grouped regions 22 as the shot regions on which the first processing device 10a or the second processing device 10b is to perform the imprint process (these will be called "multishot regions 22c" hereinafter). On the other hand, the regions 22 that could not be grouped are determined as shot regions on which the third processing device 10c or the fourth processing device 10d is to perform the imprint process (these will be called "single-shot regions 22d" hereinafter). FIG. 10A is a diagram illustrating a layout of the multishot regions 22c and the single-shot regions 22d. Here, the controller 90 may group the regions so that the number of regions on which the imprint process is performed in one batch differs between the plurality of full shot regions 22a and the plurality of partial shot regions 22b.

Figure 10B:
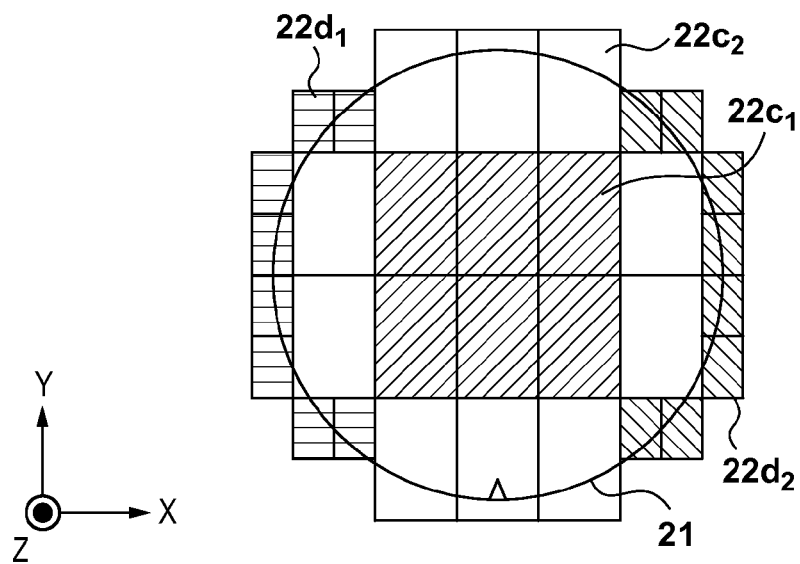
FIG. 10B is a diagram illustrating a layout of multishot regions and single-shot regions.

The controller 90 then determines the multishot regions 22c on which the first processing device 10a is to perform the imprint process (first regions $22c_1$) and the multishot regions 22c on which the second processing device 10b is to perform the imprint process (second regions $22c_2$). For example, the controller 90 determines the multishot regions 22c that are located in the central portion of the substrate 21 and do not contain the outer periphery of the substrate 21 as the first regions $22c_1$, and determines the multishot regions 22c that are located in the peripheral portion of the substrate 21 and do contain the outer periphery of the substrate 21 as the second regions $22c_2$. Furthermore, the controller 90 determines the single-shot regions 22d (third regions $22d_1$) on which the third processing device 10c is to perform the imprint process and the single-shot regions 22d (fourth regions $22d_2$) on which the fourth processing device 10d is to perform the imprint process. For example, the controller 90 determines the single-shot regions 22d located on the +X direction side to be the third regions $22d_1$ and determines the single-shot regions 22d located on the −X direction side to be the fourth regions $22d_2$. FIG. 10B is a diagram illustrating the processing devices 10 that perform the imprint process in the stated layout of the multishot regions 22c and the single-shot regions 22d.

In S203, the controller 90 conveys the substrate 21 to the respective processing devices 10 using the conveying device 80, and causes the respective processing devices 10 to perform the imprint processes on their assigned regions in the substrate 21 that has been conveyed. In S204, the controller 90 determines whether or not the imprint process has been performed on all of the regions 22 in the substrate. In S205, the controller 90 determines whether or not a region 22 in which a problem has occurred is present in the substrate 21 whose imprint process has been completed. In S206, the controller 90 changes the processing device 10 that performs the imprint process on the region located in the same position as the region 22 in which the problem occurred for the substrates on which the imprint process is performed after the substrate 21 in which the problem occurred. In S207, the controller 90 determines whether or not the imprint process has been performed on all of the substrates 21. The processes of S203 to S207 are the same as those of S103 to S107 illustrated in FIG. 5, and thus detailed descriptions thereof will not be given here.

As described thus far, the imprint apparatus according to the second embodiment uses the plurality of processing devices 10 to perform the imprint processes for the plurality of regions 22 formed in the single substrate 21 in a shared manner, based on the configurations of the respective processing devices 10. The imprint apparatus according to the second embodiment can then cause the same processing device 10 to perform the imprint processes for the regions 22 located in the same position of each substrate in the plurality of substrates 21. Through this, differences in the overlay precision among the plurality of substrates 21 can be reduced, in the same manner as with the imprint apparatus 100 according to the first embodiment.

Embodiment of Article Manufacturing Method

An article manufacturing method according to an embodiment of the present invention is favorable for manufacturing articles including micro devices such as semiconductor devices, elements having fine structures, and so on, for example. The article manufacturing method according to the present embodiment includes a process of using the stated imprint apparatus to form a pattern in a resin spread on a substrate (a process of carrying out an imprint process on a substrate) and a process of treating the substrate on which the pattern has been formed (the substrate on which the imprint process has been performed). The manufacturing method further includes other known processes (oxidation, deposition, evaporation, doping, smoothing, etching, resist separation, dicing, bonding, packaging, and the like). The article manufacturing method according to the present embodiment is more useful than conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-145382 filed on Jul. 15, 2014, which is hereby incorporated by reference herein in its entirety.

What is claimed is:

1. An imprint apparatus which performs imprint processes to a plurality of shot regions in each of a plurality of substrate, the plurality of shot regions having the same shapes with each other, the apparatus comprising:
a plurality of imprinting devices including a first imprinting device and a second imprinting device, each of which is configured to perform the imprint processes; and
a controller configured to control the plurality of imprinting devices, wherein the controller is configured to:
assign shot regions located in a first area on each substrate among the plurality of shot regions, as first shot regions for performing the imprint processes by the first imprinting device, and assign shot regions located in a second area different from the first area on each substrate among the plurality of shot regions, as second shot regions for performing the imprint processes by the second imprinting device, and
control the plurality of imprinting devices, so that the imprint processes of the first shot regions are performed by the first imprinting device and the imprint processes of the second shot regions are performed by the second imprinting device,
wherein the controller is configured to control the plurality of imprinting devices to perform the imprint processes for the plurality of substrates in parallel by assigning the first shot regions and the second shot regions thereby to control the time period required to perform the imprint processes by each of the first imprinting device and the second imprinting device.

2. The imprint apparatus according to claim 1, wherein the controller is configured to assign the first shot regions and the second shot regions, to vary the number of the first shot regions and the number of the second shot regions.

3. The imprint apparatus according to claim 1, wherein the controller is configured to assign the first shot regions and the second shot regions, to vary a moving amount of a substrate for performing the imprint processes of the first shot regions and a moving amount of the substrate for performing the imprint processes of the second shot regions.

4. The imprint apparatus according to claim 1, wherein the controller is configured to change the first shot regions and the second shot regions, in accordance with a generation of a patterning error in the imprint process by one of the plurality of imprinting devices.

5. The imprint apparatus according to claim 1, wherein the controller is configured to change the first shot regions and the second shot regions, in accordance with a generation of at least either a pattern defect or an overlay error.

6. The imprint apparatus according to claim 1, wherein the controller is configured to assign the first shot regions and the second shot regions, for the plurality of shot regions each of which is a rectangular region.

7. The imprint apparatus according to claim 1, wherein the controller is configured to assign the first shot regions and the second shot regions, for the plurality of shot regions each of which is a non-rectangular region.

8. The imprint apparatus according to claim 1, wherein
each of the plurality of imprinting devices has a holder that holds the substrate, the holder being configured to be capable of individually changing a force that attracts a substrate with respect to each of a plurality of holding regions thereof; and
the plurality of holding regions of the holder are arranged, with respect to each of the plurality of imprinting devices, based on positions of the plurality of shot regions in the substrate for which imprint processes are performed.

9. The imprint apparatus according to claim 1,
wherein the number of shot regions for which imprint processes are performed in one batch differs between a plurality of rectangular regions and a plurality of non-rectangular regions.

10. An imprint apparatus which performs an imprint process of forming a pattern of an imprint material on a substrate by using a mold, the apparatus comprising:
a plurality of imprinting devices including a first imprinting device and a second imprinting device, each of which is configured to perform the imprint process; and
a controller configured to control the plurality of imprinting devices, wherein the controller is configured to:
cause the first imprinting device to perform the imprint process for a first area on a first substrate, and cause the second processing device to perform the imprint process for a second area different from the first area on the first substrate,
cause the first imprinting device to perform the imprint process for an area on a second substrate which has the same substrate position as the first area on the first substrate, and cause the second imprinting device to perform the imprint process for an area on the second substrate which has the same substrate position as the second area on the first substrate, and
wherein the controller is configured to control the plurality of imprinting devices to perform the imprint processes on the first and second substrates in parallel by setting the first area and the second area, thereby to control the time period required to perform the imprint processes by each of the first imprinting device and the second imprinting device.

11. The imprint apparatus according to claim 10, wherein the controller is configured to set the first area and the second area, to vary the number of shot regions included in the first area and the number of shot regions included in the second area.

12. The imprint apparatus according to claim 11, wherein each shot region is a rectangular region.

13. The imprint apparatus according to claim 11, wherein each shot region is a non-rectangular region.

14. The imprint apparatus according to claim 10, wherein the controller is configured to set the first area and the second area, to vary a moving amount of the first substrate for performing the imprint process of the first area and a moving amount of the first substrate for performing the imprint process of the second area.

15. The imprint apparatus according to claim 10, wherein the controller is configured to, in accordance with a generation of at least one of pattern defects and overlay error in the imprint process for the first area on the first substrate by the first imprinting device, cause the second imprinting device to perform the imprint process for a shot region on the second substrate arranged at the same substrate position as the shot region with the generation.

16. The imprint apparatus according to claim 10, wherein the controller is configured to, in a case where a shot region with a pattern forming error is generated on the first substrate in the imprint process by the first imprinting device, cause the second imprinting device to perform the imprint process for a shot region on the second substrate arranged at the same substrate position as the shot region with the patterning error.

17. An imprint apparatus which performs imprint processes to a plurality of shot regions in each of a plurality of substrate, the plurality of shot regions having the same shapes with each other, the apparatus comprising:
   a plurality of imprinting devices including a first imprinting device and a second imprinting device, each of which is configured to perform the imprint processes; and
   a controller configured to:
      set a first area and a second area for each substrate, the first area and the second area having different positions in a substrate from each other, and
      control the plurality of imprintng devices, so as to cause the first imprinting device to perform the imprint processes for shot regions included in the first area of each substrate, and cause the second imprinting device to perform the imprint processes for shot regions included in the second area of each substrate,
   wherein the imprint processes by the first imprinting device for the first area of a first substrate and the imprint processes by the second imprinting device for the second area of a second substrate are performed in parallel, and
   wherein the controller is configured to set the first area and the second area, so that a difference between a time period required to perform the imprint processes by the first imprinting device for shot regions included in the first area of the first substrate and a time period required to perform the imprint processes by the second imprinting device for shot regions included in the second area of the second substrate is reduced.

18. An imprint apparatus which performs imprint processes to a plurality of shot regions in each of a plurality of substrate, the plurality of shot regions having the same shapes with each other, the apparatus comprising:
   a plurality of imprinting devices including a first imprinting device and a second imprinting device, each of which is configured to perform the imprint processes; and
   a controller configured to control the plurality of imprinting devices, wherein the controller is configured to:
      assign shot regions located in a first area on each substrate among the plurality of shot regions, as first shot regions for performing the imprint processes by the first imprinting device, and assign shot regions located in a second area different from the first area on each substrate among the plurality of shot regions, as second shot regions for performing the imprint processes by the second imprinting device, and
      control the plurality of imprinting devices, so that the imprint processes of the first shot regions are performed by the first imprinting device and the imprint processes of the second shot regions are performed by the second imprinting device,
   wherein the controller is configured to control the plurality of imprinting devices to perform the imprint processes for the plurality of substrates in parallel by assigning the first shot regions and the second shot regions thereby to control the time period required to perform the imprint processes by each of the first imprinting device and the second imprinting device, by assigning the first shot regions and the second shot regions to either
   (i) vary the number of the first shot regions and the number of the second shot regions, or
   (ii) vary a moving amount of a substrate for performing the imprint processes of the first shot regions and a moving amount of the substrate for performing the imprint processes of the second shot regions.

19. The imprint apparatus according to claim 1, wherein each imprinting device comprises a mold.

20. The imprint apparatus according to claim 10, wherein each imprinting device comprises a mold.

* * * * *